(12) United States Patent
Tokuyasu et al.

(10) Patent No.: US 10,550,295 B2
(45) Date of Patent: Feb. 4, 2020

(54) FILM FOR TEMPORARY FIXING, FILM SHEET FOR TEMPORARY FIXING AND SEMICONDUCTOR DEVICE

(71) Applicant: HITACHI CHEMICAL COMPANY, LTD., Tokyo (JP)

(72) Inventors: Takahiro Tokuyasu, Tokyo (JP); Masanori Natsukawa, Tokyo (JP); Yasuyuki Ooyama, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 495 days.

(21) Appl. No.: 15/107,985

(22) PCT Filed: Dec. 24, 2014

(86) PCT No.: PCT/JP2014/084120
§ 371 (c)(1),
(2) Date: Jun. 24, 2016

(87) PCT Pub. No.: WO2015/098949
PCT Pub. Date: Jul. 2, 2015

(65) Prior Publication Data
US 2016/0326409 A1 Nov. 10, 2016

(30) Foreign Application Priority Data
Dec. 26, 2013 (JP) .................. 2013-268906

(51) Int. Cl.
*C09J 133/00* (2006.01)
*C09J 7/20* (2018.01)
(Continued)

(52) U.S. Cl.
CPC ............ *C09J 133/00* (2013.01); *C08L 33/06* (2013.01); *C08L 43/04* (2013.01); *C08L 67/04* (2013.01);
(Continued)

(58) Field of Classification Search
None
See application file for complete search history.

(56) References Cited

U.S. PATENT DOCUMENTS

2009/0075008 A1* 3/2009 Hwang .................. C09J 133/14
428/41.7
2010/0129987 A1* 5/2010 Kamiya .................... B32B 7/12
438/464
(Continued)

FOREIGN PATENT DOCUMENTS

CN 101993668 3/2011
CN 103265907 A * 8/2013
(Continued)

OTHER PUBLICATIONS

Derwent Abstract for JP 2012186361 A (Year: 2012).*
(Continued)

*Primary Examiner* — Frank D Ducheneaux
(74) *Attorney, Agent, or Firm* — Fitch, Even, Tabin & Flannery, LLP

(57) ABSTRACT

The film for temporary fixing of the present invention is a film for temporary fixing which is used in a processing method of a semiconductor wafer, the method including a temporary fixing step of temporarily fixing the semiconductor wafer to a support via the film for temporary fixing, a processing step of processing the semiconductor wafer that is temporarily fixed to the support, and a separation step of separating the processed semiconductor wafer from the support and the film for temporary fixing, contains (A) a high molecular weight component and (B) a silicone-modified resin, and has a modulus of elasticity of from 0.1 to 1000 MPa at 23° C. after being heated for 30 minutes at 110° C. and for 1 hour at 170° C.

17 Claims, 5 Drawing Sheets

(51) Int. Cl.
*C09J 7/00* (2018.01)
*C09J 133/06* (2006.01)
*C09J 167/04* (2006.01)
*C09J 183/04* (2006.01)
*C09J 143/04* (2006.01)
*C08L 83/04* (2006.01)
*C08L 67/04* (2006.01)
*C08L 43/04* (2006.01)
*C08L 33/06* (2006.01)
*C08G 77/445* (2006.01)
*H01L 21/78* (2006.01)
*H01L 21/683* (2006.01)
*H01L 25/065* (2006.01)

(52) U.S. Cl.
CPC ............ *C08L 83/04* (2013.01); *C09J 7/00* (2013.01); *C09J 133/06* (2013.01); *C09J 143/04* (2013.01); *C09J 167/04* (2013.01); *C09J 183/04* (2013.01); *H01L 21/6835* (2013.01); *H01L 21/6836* (2013.01); *H01L 21/78* (2013.01); *H01L 25/0657* (2013.01); *C08G 77/445* (2013.01); *C09J 7/20* (2018.01); *C09J 2201/606* (2013.01); *C09J 2201/622* (2013.01); *C09J 2203/326* (2013.01); *C09J 2433/00* (2013.01); *C09J 2467/00* (2013.01); *H01L 2221/68327* (2013.01); *H01L 2221/68386* (2013.01); *H01L 2224/03002* (2013.01); *H01L 2224/05009* (2013.01); *H01L 2224/08146* (2013.01); *H01L 2224/08155* (2013.01); *H01L 2224/94* (2013.01); *H01L 2225/06513* (2013.01); *H01L 2225/06517* (2013.01); *H01L 2225/06541* (2013.01); *H01L 2225/06565* (2013.01); *H01L 2924/35121* (2013.01)

(56) References Cited

U.S. PATENT DOCUMENTS

| | | | | |
|---|---|---|---|---|
| 2011/0084413 | A1* | 4/2011 | Shishido | C08G 59/4261 |
| | | | | 257/798 |
| 2013/0165603 | A1* | 6/2013 | Wi | C08G 59/50 |
| | | | | 525/523 |

FOREIGN PATENT DOCUMENTS

| | | | | |
|---|---|---|---|---|
| JP | H3-263475 | A | 11/1991 | |
| JP | H4-020954 | | 4/1992 | |
| JP | 2005-028734 | A | 2/2005 | |
| JP | 2005-120206 | A | 5/2005 | |
| JP | 2009-083271 | A | 4/2009 | |
| JP | 2009-124115 | A | 6/2009 | |
| JP | 2010-126598 | A | 6/2010 | |
| JP | 4565804 | B2 | 8/2010 | |
| JP | 2011-054939 | A | 3/2011 | |
| JP | 2011-102383 | A | 5/2011 | |
| JP | 4732472 | B2 | 7/2011 | |
| JP | 4936667 | B2 | 3/2012 | |
| JP | 2012-126803 | A | 7/2012 | |
| JP | 2012186361 | A * | 9/2012 | ............ H01L 24/27 |
| JP | 5157229 | B2 | 3/2013 | |
| JP | 5343450 | B2 | 11/2013 | |
| TW | 201211191 | A | 3/2012 | |
| WO | 2010/137443 | A1 | 12/2010 | |

OTHER PUBLICATIONS

Derwent Abstract for CN 103265907 A (Year: 2013).*
International Search Report of WO Appln. No. PCT/JP2014/084120 dated Mar. 3, 2015 in English.
International Preliminary Report of WO Appln. No. PCT/JP2014/084120 dated Jul. 7, 2016 in English.

* cited by examiner (A)

(B)

(A)

(B)

(A)

(B)

(C)

(D)

(A)

(B)

(C)

(A)

(B)

FILM FOR TEMPORARY FIXING, FILM SHEET FOR TEMPORARY FIXING AND SEMICONDUCTOR DEVICE

TECHNICAL FIELD

The present invention relates to a film for temporary fixing and a film sheet for temporary fixing which are used when a semiconductor wafer is processed, and a semiconductor device manufactured by using these.

BACKGROUND ART

A stacked MCP (Multi Chip Package) obtained by stacking semiconductor elements in multiple stages so as to have a high capacity has become widespread in association with the multi-functionalization of electronic devices such as a smartphone and a tablet PC, and a film-shaped adhesive that is advantageous in the mounting step is widely used as an adhesive for die bonding in the mounting of the semiconductor element. However, regardless of a tendency of multi-functionalization in this manner, the operation of the electronic devices tends to be slower since the processing speed of the data is limited by the connection method of the semiconductor element using the current wire bond. In addition, power saving is also being desired since there is a growing need to use the electronic devices for a long time without charging them while keeping the power consumption low. From such a viewpoint, in recent years, semiconductor devices having a new structure in which the semiconductor elements are connected to one another not by the wire bond but by a through electrode for the purpose of further increasing the speed and saving the power have also been developed.

High capacity is still desired although semiconductor devices having a new structure have been developed in this manner, and the development of a technique that is able to stack semiconductor elements in more multiple stages has been promoted regardless of the package structure. However, stable thinning of the semiconductor element is essential in order to stack a greater number of semiconductor elements in a limited space.

Currently, in the step of grinding a semiconductor wafer for thinning the semiconductor element, it has become the mainstream to grind a semiconductor wafer in a state of being supported by pasting a support tape, so-called BG tape to the semiconductor wafer. However, the thinned semiconductor wafer is likely to warp by the influence of the circuit applied to the surface thereof, and the BG tape that is a deformable tape material becomes not possible to adequately support the thinned semiconductor wafer.

From such a background, a thinning process of a semiconductor wafer to use a silicon wafer or glass that is a harder material than the BG tape as the support has been proposed, and a material to stick a semiconductor wafer to a silicon wafer or glass of the support has been proposed. It is required as an important characteristic to such a sticking material that the semiconductor wafer after being ground can be peeled off from the support without being damaged, and the peeling method is intensively investigated in order to satisfy such a characteristic. Examples of the peeling method may include those utilizing the dissolution of the sticking material in a solvent, those in which the peeling properties are improved by decreasing the stickiness through heating (for example, Patent Literature 1), and those utilizing the fact that the sticking material is modified or eliminated by being irradiated with a laser beam (for example, Patent Literature 2). However, it takes time to dissolve the sticking material in a solvent, and thus the productivity is likely to decrease. In addition, in the method to decrease the stickiness through heating, it is concerned that the semiconductor wafer is adversely affected by heating, and also the method is poor in heat resistance and thus it cannot be used in the process application to form a through electrode. On the other hand, in the method to modify or eliminate the sticking material by irradiating it with a laser beam, the installation of expensive laser equipment is essential and a considerable investment is essential for the application of such a process.

CITATION LIST

Patent Literature

Patent Literature 1: Japanese Patent No. 4936667
Patent Literature 2: Japanese Patent No. 4565804

SUMMARY OF INVENTION

Technical Problem

The sticking materials in the prior art are mostly liquid ones, and they are used by being coated on a semiconductor wafer or a support by spin coating or the like and heated or irradiated with UV so as to be formed into a film. However, in such a case, the variation in thickness of the individual semiconductor wafers after being ground is likely to be caused by the variation in coating of the sticking material, and spin coating has a problem that it is necessary to discard the material scattered by the rotation at the time of coating. On the other hand, it is easier to control the film thickness in a film-shaped sticking material, and thus it is possible to reduce the variation in thickness among individual semiconductor wafers. In addition, the film-shaped sticking material can be formed into a film on a semiconductor wafer or a support by a simple method such as lamination, and thus it can be expected that the workability also becomes favorable.

In addition, the semiconductor wafer to be ground is not limited to those having high smoothness, but the wafers that are equipped with solder balls on the circuit surface and have surface unevenness of being greater than 80 μm also tend to increase. It is relatively difficult to peel off the pressure sensitive adhesive from the surface with such large unevenness, and it is concerned that the solder balls are lost at the time of peeling off the pressure sensitive adhesive in a case in which the adhesive strength of the solder balls is inadequate.

The present invention has been made in view of the above circumstances, and an object thereof is to provide a film for temporary fixing and the film for temporary fixing which can adequately fix a semiconductor wafer on a support and in which the semiconductor wafer after being processed can be easily separated from the support, and a film sheet for temporary fixing, and a semiconductor device manufactured by using these.

Solution to Problem

The present invention provides a film for temporary fixing which is used in a processing method of a semiconductor wafer, the method including a temporary fixing step of temporarily fixing the semiconductor wafer to a support via the film for temporary fixing, a processing step of processing the semiconductor wafer that is temporarily fixed to the support, and a separation step of separating the processed semiconductor wafer from the support and the film for temporary fixing, contains (A) a high molecular weight component and (B) a silicone-modified resin, and has a modulus of elasticity of from 0.1 to 1000 MPa at 23° C. after being heated for 30 minutes at 110° C. and for 1 hour at 170° C.

According to the film for temporary fixing according to the present invention, it is possible to adequately fix a semiconductor wafer on a support and also to easily separate the semiconductor wafer after being processed from the support and the film for temporary fixing. In addition, the film for temporary fixing according to the present invention has a modulus of elasticity described above, and thus it can be easily peeled off from a semiconductor wafer having unevenness.

In the film for temporary fixing according to the present invention, it is preferable that (A) the high molecular weight component include a (meth)acrylic copolymer having a glass transition temperature of from −50° C. to 50° C., a weight average molecular weight of from 100,000 to 1,200,000, and a crosslinkable functional group.

In addition, it is preferable that (B) the silicone-modified resin include a silicone-modified alkyd resin.

Furthermore, it is preferable that the content of (B) the silicone-modified resin be from 1 to 100 parts by mass with respect to 100 parts by mass of (A) the high molecular weight component.

The film for temporary fixing according to the present invention can further contain (C) a curing accelerator.

It is preferable that the film for temporary fixing according to the present invention have a melt viscosity of 15000 Pa·s or less at 120° C. and a thickness of from 10 to 150 nm.

In the film for temporary fixing according to the present invention, it is preferable that a 30° peel strength between a semiconductor wafer and the film for temporary fixing be 300 N/m or less.

The present invention also provides a film sheet for temporary fixing which includes a support film exhibiting releasability and the film for temporary fixing according to any one of claims 1 to 7 provided on the support film.

The present invention also provides a semiconductor device which includes a semiconductor element obtained from a semiconductor wafer processed by using the film for temporary fixing or film sheet for temporary fixing according to the present invention.

Advantageous Effects of Invention

According to the present invention, it is possible to provide a film for temporary fixing and a film sheet for temporary fixing which can adequately fix a semiconductor wafer on a support and in which the semiconductor wafer after being processed can be easily separated from the support and the film for temporary fixing, and a semiconductor device manufactured by using these.

DESCRIPTION OF EMBODIMENTS

Figure 1:
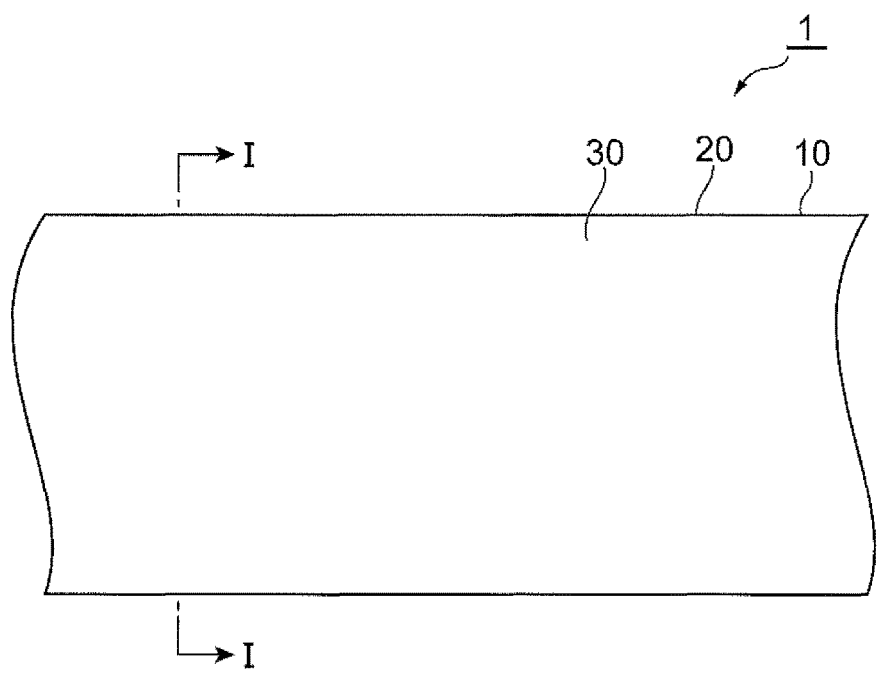
FIG. 1A is a top view which illustrates an embodiment of a film sheet for temporary fixing according to the present invention.
FIG. 1B is a schematic cross-sectional view that is taken along the line I-I in FIG. 1A.
Figure 1:
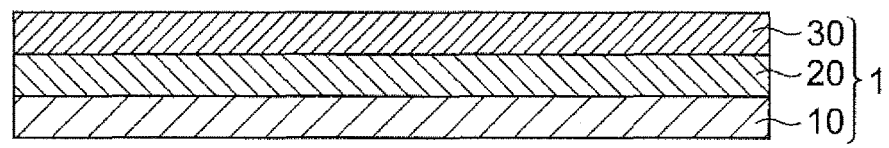

Hereinafter, preferred embodiments of the present invention will be described in detail with reference to the accompanying drawings. Incidentally, in the drawings, the same reference numerals are given to the same or corresponding parts, and duplicate description will be omitted. In addition, the dimensional ratios in the drawings are not limited to the illustrated ratios.

[Film for Temporary Fixing]

The film for temporary fixing of the present invention is a film for temporary fixing which is used in a processing method of a semiconductor wafer including a temporary fixing step of temporarily fixing the semiconductor wafer to a support via the film for temporary fixing, a processing step of processing the semiconductor wafer that is temporarily fixed to the support, and a separation step of separating the processed semiconductor wafer from the support and the film for temporary fixing, contains (A) a high molecular weight component and (B) a silicone-modified resin, and has a modulus of elasticity of from 0.1 to 1000 MPa at 23° C. after being heated for 30 minutes at 110° C. and for 1 hour at 170° C.

As (A) the high molecular weight component to be used in the present embodiment, it is possible to use a polymer having a crosslinkable functional group. Examples of the polymer may include a polyimide resin, a (meth)acrylic copolymer, a urethane resin, a polyphenylene ether resin, a polyetherimide resin, a phenoxy resin, and a modified polyphenylene ether resin. Among these, a (meth)acrylic copolymer having a crosslinkable functional group is preferable. Incidentally, in the present specification, the term "(meth)acrylic" is used in the meaning of either of acrylic or methacrylic. The above resins may be used singly or in combination of two or more kinds thereof.

As the (meth) acrylic copolymer having a crosslinkable functional group described above, those obtained by a polymerization method such as pearl polymerization or solution polymerization may be used, or a commercially available product may be used.

The polymer may have a crosslinkable functional group in the polymer chain or at the polymer chain terminal. Specific examples of the crosslinkable functional group may include an epoxy group, an alcoholic hydroxyl group, a phenolic hydroxyl group, and a carboxyl group, and among these, a carboxyl group is preferable. The carboxyl group can be introduced into the polymer chain by using acrylic acid.

In the present embodiment, it is preferable to use a (meth)acrylic copolymer having a carboxyl group, and examples thereof may include a (meth)acrylic acid ester copolymer having a carboxyl group and an acrylic rubber having a carboxyl group. Among these, a (meth)acrylic acid ester copolymer having a carboxyl group is preferable. The acrylic rubber is one that has an acrylic acid ester as a main component, and examples thereof may include rubber composed of a copolymer of butyl acrylate and/or ethyl acrylate and acrylonitrile.

The glass transition temperature (hereinafter, referred to as "Tg") of the high molecular weight component is preferably from −50° C. to 50° C. and more preferably from −30° C. to 20° C. When the Tg is in such a range, it is possible to obtain adequate fluidity while suppressing the deterioration of handling properties caused by an excessive increase in tackiness of the sheet after being molded, further it is possible to lower the modulus of elasticity after being cured, and it is possible to suppress an excessive increase in peeling strength.

The glass transition temperature refers to one that is measured by using a DSC (differential thermal scanning calorimeter) (for example, "Thermo Plus 2" manufactured by Rigaku Corporation).

The weight average molecular weight of the high molecular weight component is not particularly limited, but it is preferably from 100,000 to 1,200,000 and more preferably from 200,000 to 1,000,000. It becomes easy to secure the fluidity and film formability when the weight average molecular weight of the high molecular weight component is in such a range.

The weight average molecular weight is a polystyrene-converted value using a calibration curve by standard polystyrene and gel permeation chromatography (GPC).

(B) the silicone-modified resin to be used in the present embodiment is not particularly limited as long as it is a resin that is modified with silicone.

As the silicone-modified resin, a silicone-modified alkyd resin is preferable.

It is possible to easily peel off the film for temporary fixing from the semiconductor wafer without using a solvent when the film for temporary fixing is peeled off from the semiconductor wafer as the film for temporary fixing contains a silicone-modified alkyd resin.

Examples of the method for obtaining a silicone-modified alkyd resin may include (i) a common synthesis reaction to obtain an alkyd resin, namely a method in which an organopolysiloxane is simultaneously reacted as an alcohol component when a polyhydric alcohol and a fatty acid, a polybasic acid, and the like are reacted (ii) a method in which an organopolysiloxane is reacted to a general alkyd resin that is synthesized in advance.

Examples of the polyhydric alcohol to be used as a raw material for the alkyd resin may include a dihydric alcohol such as ethylene glycol, diethylene glycol, triethylene glycol, propylene glycol, trimethylene glycol, tetramethylene glycol, or neopentyl glycol, a trihydric alcohol such as glycerin, trimethylolethane, or trimethylolpropane, a polyhydric alcohol of tetrahydric or higher such as diglycerin, triglycerin, pentaerythritol, dipentaerythritol, mannitol, or sorbitol. These may be used singly or in combination of two or more kinds thereof.

Examples of the polybasic acid to be used as a raw material for the alkyd resin may include an aromatic polybasic acid such as phthalic anhydride, terephthalic acid, isophthalic acid, or trimellitic anhydride, an aliphatic saturated polybasic acid such as succinic acid, adipic acid, or sebacic acid, an aliphatic unsaturated polybasic acid such as maleic acid, maleic anhydride, fumaric acid, itaconic acid, or citraconic anhydride, and a polybasic acid obtained by the Diels-Alder reaction such as cyclopentadiene-maleic anhydride adduct, terpene-maleic anhydride adduct, or rosin-maleic anhydride adduct. These may be used singly or in combination of two or more kinds thereof.

The alkyd resin may further contain a modifying agent or a crosslinking agent.

Examples of the modifying agent may include octyl acid, lauric acid, palmitic acid, stearic acid, oleic acid, linoleic acid, linolenic acid, eleostearic acid, ricinoleic acid, and dehydrated ricinoleic acid or coconut oil, linseed oil, tung oil, castor oil, dehydrated castor oil, soybean oil, safflower oil, and fatty acids of these may be used. These may be used singly or in combination of two or more kinds thereof.

Examples of the crosslinking agent may include an amino resin such as a melamine resin or a urea resin, a urethane resin, an epoxy resin, and a phenol resin. Among these, it is preferable to use an amino resin since an amino alkyd resin crosslinked with an amino resin is obtained. The crosslinking agents may be used singly or in combination of two or more kinds thereof.

It is possible to use an acid catalyst as a curing catalyst in the silicone-modified alkyd resin. The acid catalyst is not particularly limited, and it can be appropriately selected from known acid catalysts and used as a catalyst for crosslinking reaction of the alkyd resin. As such an acid catalyst, for example, an organic acid catalyst such as p-toluenesulfonic acid or methanesulfonic acid is suitable. The acid catalysts may be used singly or in combination of two or more kinds thereof.

Examples of the silicone-modified alkyd resin as described above may include the Tesfine TA31-209E (trade name manufactured by Hitachi Chemical Co., Ltd.).

In the present embodiment, it is preferable to use polyether-modified silicone, alkyl-modified silicone, epoxy-modified silicone, and the like in combination at the same time as the silicone modified alkyd resin from the viewpoint of easily peeling off the film for temporary fixing.

Examples of the silicone as described above may include SH3773M, L-7001, SH-550, and SH-710 manufactured by Dow Corning Toray, and X-22-163, KF-105, X-22-163B, and X-22-163C manufactured by Shin-Etsu Chemical Co., Ltd., but the silicone is not particularly limited as long as it is compatible with the high molecular weight material.

The amount of (B) the silicone-modified resin blended in the film for temporary fixing according to the present embodiment is preferably from 1 to 100 parts by mass and more preferably from 10 to 80 parts by mass with respect to 100 parts by mass of (A) the high molecular weight component. It becomes possible to achieve both the adhesive properties at the time of processing the semiconductor wafer and the peeling properties after being processed when the amount of (B) the silicone-modified resin blended is within the above range. In addition, the amount of (B) the silicone-modified resin blended with respect to 100 parts by mass of (A) the high molecular weight component is preferably 30 parts by mass or more.

The film for temporary fixing according to the present embodiment can contain (C) a curing accelerator and other components if necessary other than (A) the high molecular weight component and (B) the silicone-modified resin.

Examples of (C) the curing accelerator may include an imidazole, a dicyandiamide derivative, dicarboxylic acid dihydrazide, triphenyl phosphine, tetraphenylphosphonium tetraphenylborate, 2-ethyl-4-methylimidazole-tetraphenyl borate, and 1,8-diazabicyclo[5,4,0]undecene-7-tetraphenyl borate. These may be used singly or in combination of two or more kinds thereof.

In a case in which the film for temporary fixing according to the present embodiment contains a (meth)acrylic copolymer having a carboxyl group, it is preferable to contain a curing accelerator to accelerate the curing of the epoxy group contained in the acrylic copolymer.

In a case in which the amount of the curing accelerator added is too small, it becomes difficult to completely cure the film for temporary fixing by the heat history in the manufacturing process of the semiconductor element and thus there is a possibility that the semiconductor wafer and the support cannot be securely fixed to each other. On the other hand, in a case in which the amount of the curing accelerator added is too great, not only the melt viscosity of the film for temporary fixing is likely to increase by heating during the manufacturing process but also the storage stability of the film tends to be poor. From such a viewpoint, the amount of (C) the curing accelerator in the film for temporary fixing according to the present embodiment is preferably from 0.01 to 2.0 parts by mass with respect to 100 parts by mass of (A) the high molecular weight component.

Examples of other components may include an inorganic filler. As the inorganic filler, it is preferable to blend a silica filler from the viewpoint of improving the handling properties of the film for temporary fixing in the B-stage and the low thermal expansion properties. In this case, it is preferable to blend the inorganic filler at from 10 to 100 parts by mass with respect to 100 parts by mass of the high molecular weight component from the viewpoint of the handling properties of the uncured film for temporary fixing.

In addition, the film for temporary fixing according to the present embodiment can contain a coupling agent from the viewpoint of heat resistance. Examples of the coupling agent may include γ-ureidopropyltriethoxysilane, γ-mercaptopropyltrimethoxysilane, 3-phenyl-aminopropyltrimethoxysilane, and 3-(2-aminoethyl) aminopropyltrimethoxysilane.

In addition, the film for temporary fixing according to the present embodiment can contain a thermosetting resin such as an epoxy resin, a phenol resin, or a bismaleimide resin.

It is preferable that the film for temporary fixing according to the present embodiment have a modulus of elasticity of from 0.1 to 1000 MPa at 23° C. after being heated for 30 minutes at 110° C. and for 1 hour at 170° C. The film becomes soft when the modulus of elasticity at 23° C. is 0.1 MPa or higher, and thus it is possible to reduce the possibility that the adhesive residue is generated on the semiconductor wafer at the time of the peeling step, and the film for temporary fixing is easily peeled off from the semiconductor wafer having unevenness such as a bump as well when the modulus of elasticity at 23° C. is 1000 MPa or less.

The modulus of elasticity refers to the measured value in the case of measuring the modulus of elasticity using a dynamic viscoelasticity measuring device (manufactured by UBM Co., Ltd.) while raising the temperature at a rate of temperature rise of 3° C./min.

It is preferable that the film for temporary fixing according to the present embodiment have a melt viscosity of 15000 Pa·s or less at 120° C. before being cured. It becomes possible to press the film for temporary fixing to a semiconductor wafer without causing a void, for example, under the conditions of from 70 to 150° C./from 0.02 to 0.2 MPa/from 1 to 5 minutes/from 5 to 15 mbar when the melt viscosity at 120° C. is 15000 Pa·s or less. Furthermore, it is possible to obtain adequate fluidity when the film for temporary fixing is vacuum pressed to a semiconductor wafer under the above conditions and to suppress the occurrence of a void when the melt viscosity at 120° C. is 15000 Pa·s or less.

The above melt viscosity refers to the measured value in the case of measuring the melt viscosity while applying 5% strain to the film for temporary fixing and raising the temperature at a rate of temperature rise of 20° C./min by using the ARES (manufactured by Rheometric Scientific Inc.).

The thickness of the film for temporary fixing according to the present embodiment is preferably from 10 to 150 μm from the viewpoint of securing the temporarily fixing function and being able to adequately filling the unevenness such as the bump of the semiconductor wafer. The film for temporary fixing is excellent in adequately embedding the bump when the film thickness is 10 μm or more, and it is economical when the film thickness is 150 μm or less. In a case in which a bump is formed on the semiconductor wafer, the film thickness is preferably from 15 to 150 μm and more preferably from 30 to 110 μm from the viewpoint of adequately embedding the bump. In a case in which a bump is not formed on the semiconductor wafer, the film thickness is preferably from 10 to 30 μm and more preferably from 10 to 20 μm from the economic point of view.

In the film for temporary fixing according to the present embodiment, it is preferable that the 30° peel strength between a semiconductor wafer (for example, silicon wafer) and the film for temporary fixing be 300 N/m or less. In this case, it becomes easy to prevent the cracking and the like of a semiconductor wafer when the semiconductor wafer and the film for temporary fixing are peeled off.

The film for temporary fixing according to the present embodiment can be manufactured from a varnish of the composition for forming a film for temporary fixing containing the respective components described above.

Specifically, first, (A) the high molecular weight component and (B) the silicone-modified resin, and, if necessary, (C) the curing accelerator and other additive components such as the inorganic filler and the coupling agent are mixed in an organic solvent and kneaded to prepare a varnish. Next, a layer of varnish is formed by coating the varnish thus obtained on a base film. Next, the solvent is removed from the varnish layer by heating and drying and the base film is then removed, whereby a film for temporary fixing is obtained.

The mixing and kneading can be performed by using an ordinary stirrer, a kneader, and a dispersing machine such as a triple roll or a ball mill and appropriately combining these. The heating and drying is not particularly limited as long as it has a condition in which the used solvent is adequately volatilized, but it can be performed by heating the base film coated with the varnish usually for from 0.1 to 90 minutes at from 60° C. to 200° C.

The base film is not particularly limited, and examples thereof may include a polyester film, a polypropylene film, a polyethylene terephthalate film, a polyimide film, a polyetherimide film, a polyether naphthalate film, and a methylpentene film.

The organic solvent is not limited as long as it can uniformly dissolve and knead or disperse the respective components, and those that are known in the prior art can be used. Examples of such a solvent may include a ketone-based solvent such as acetone, methyl ethyl ketone, methyl isobutyl ketone, or cyclohexanone, dimethylformamide, dimethylacetamide, N-methyl-2-pyrrolidone, toluene, and xylene. It is preferable to use methyl ethyl ketone, cyclohexanone, and the like from the viewpoint of having a fast drying speed and a low price.

FIG. 1(A) is a top view which illustrates an embodiment of a film sheet for temporary fixing according to the present invention, and FIG. 1(B) is a schematic cross-sectional view that is taken along the line I-I in FIG. 1(A).

A film sheet for temporary fixing 1 illustrated in FIG. 1 includes a support film 10 exhibiting releasability, a film for temporary fixing 20 provided on the support film 10, and a protective film 30 provided on the side opposite to the support film 10 of the film for temporary fixing 20.

The support film 10 is not particularly limited, but examples thereof may include polyethylene terephthalate, polybutylene terephthalate, polyethylene naphthalate, polyethylene, polypropylene, polyamide, and polyimide. Among these, the support film 10 is preferably polyethylene terephthalate, polybutylene terephthalate, polyethylene naphthalate, polypropylene, polyamide, and polyimide from the viewpoint of flexibility and toughness. In addition, it is preferable to use a film subjected to the release treatment by a silicone-based compound, a fluorine-based compound, or the like as a support film from the viewpoint of improving the peeling properties with the film for temporary fixing (resin layer).

The thickness of the support film 10 may be appropriately changed depending on the intended flexibility, but it is preferably from 3 to 250 μm. The film strength is adequate when the thickness is 3 μm or more, and adequate flexibility is obtained when the thickness is 250 μm or less. From this point of view, the thickness of the support film 10 is more preferably from 5 to 200 μm and even more preferably from 7 to 150 μm.

The thickness of the film for temporary fixing 20 of the present embodiment is preferably from 10 to 150 μm from the viewpoint of securing the temporarily fixing function and being able to adequately filling the unevenness such as the bump of the semiconductor wafer. The film for temporary fixing is excellent in adequately embedding the bump when the film thickness is 10 μm or more, and it is economical when the film thickness is 150 μm or less. In a case in which a bump is formed on the semiconductor wafer, the film thickness is preferably from 15 to 150 μm and more preferably from 30 to 110 μm from the viewpoint of adequately embedding the bump. In a case in which a bump is not formed on the semiconductor wafer, the film thickness is preferably from 10 to 30 μm and more preferably from 10 to 20 μm from the economic point of view.

The films which are formed in advance and have a thickness of 100 μm or less may be bonded together in the case of manufacturing a thick film. It is possible to decrease the residual solvent when a thick film is manufactured by using the bonded film as described above.

The protective film 30 is not particularly limited, but examples thereof may include polyethylene terephthalate, polybutylene terephthalate, polyethylene naphthalate, polyethylene, and polypropylene. Among these, the protective film 30 is preferably polyethylene terephthalate, polyethylene, and polypropylene from the viewpoint of flexibility and toughness. In addition, it is preferable to use a film subjected to the release treatment by a silicone-based compound, a fluorine-based compound, or the like as a protective film from the viewpoint of improving the peeling properties with the film for temporary fixing (resin layer).

The thickness of the protective film 30 can be appropriately set depending on the intended flexibility, but it is preferably from 10 to 250 μm. The film strength is adequate when the thickness is 10 μm or more, and adequate flexibility is obtained when the thickness is 250 μm or less. From this point of view, the thickness of the protective film 30 is more preferably from 15 to 200 μm and even more preferably from 20 to 150 μm.

FIG. 2(A) is a top view which illustrates another embodiment of a film sheet for temporary fixing according to the present invention, and FIG. 2(B) is a schematic cross-sectional view that is taken along the line in FIG. 2(A).

Figure 2:
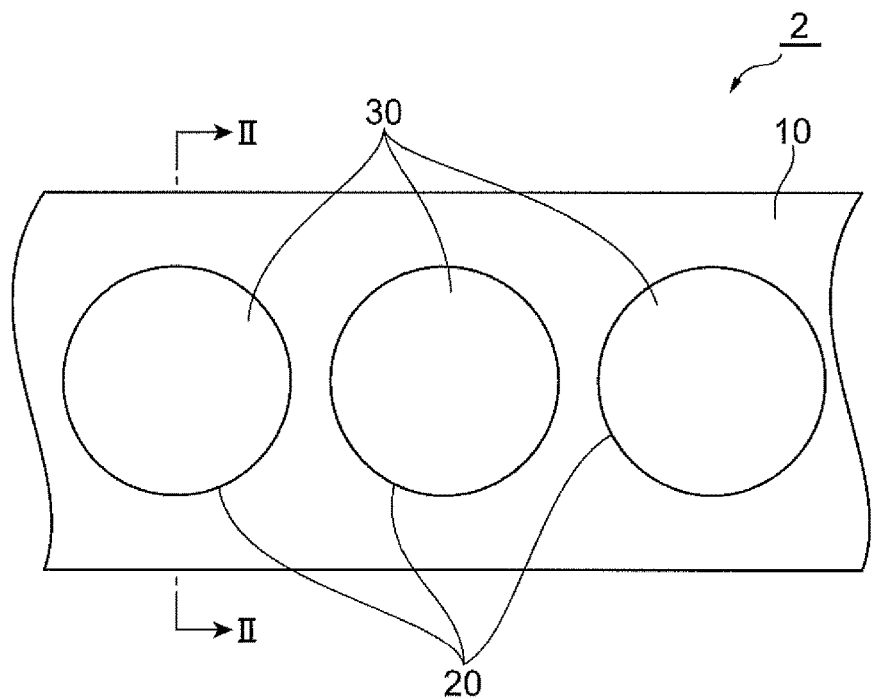
FIG. 2A is a top view which illustrates another embodiment of a film sheet for temporary fixing according to the present invention.
FIG. 2B is a schematic cross-sectional view that is taken along the line II-II in FIG. 2A.
Figure 2:
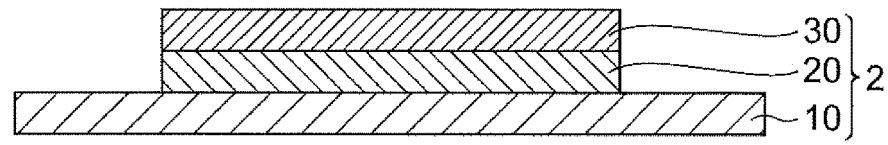

A film sheet for temporary fixing 2 illustrated in FIG. 2 has the same configuration as the film sheet for temporary fixing 1 except that the film for temporary fixing 20 and the protective film 30 are cut in advance in accordance with the shape of the member to be temporarily fixed. Incidentally, in FIG. 2, the outer edge portion of the film for temporary fixing 20 and the protective film 30 which are cut is removed, but a cut may be provided to the film for temporary fixing and the protective film in accordance with the shape of the member to be temporarily fixed and the outer edge portion may be left.

[Processing Method of Semiconductor Wafer]

The processing method of a semiconductor wafer according to the present embodiment briefly includes the following 4 steps. It includes (a) a temporary fixing step of temporarily fixing a semiconductor wafer to a support via a film for temporary fixing, (b) a processing step of processing the semiconductor wafer that is temporarily fixed to the support, (c) a separation step of separating the processed semiconductor wafer from the support and the film for temporary fixing, and (d) a cleaning step of cleaning a residue in a case in which there is the residue on the semiconductor wafer.

Figure 3:
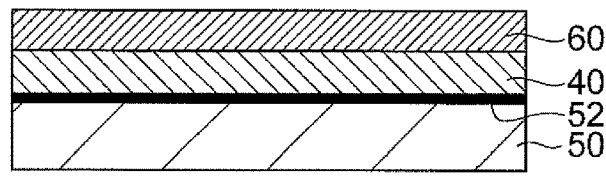
FIG. 3A, FIG. 3B, and FIG. 3C are schematic cross-sectional views for describing an embodiment of the processing method of a semiconductor wafer.
FIG. 3D is a top view which illustrates the semiconductor wafer after being processed.
Figure 3:
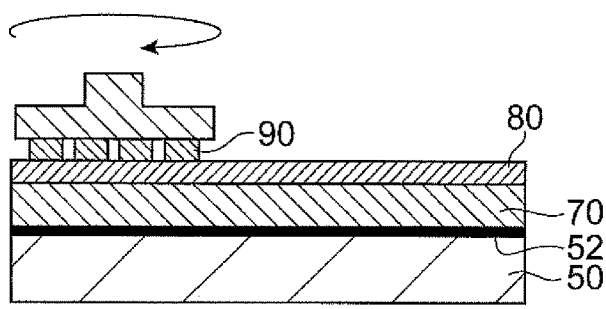
Figure 3:
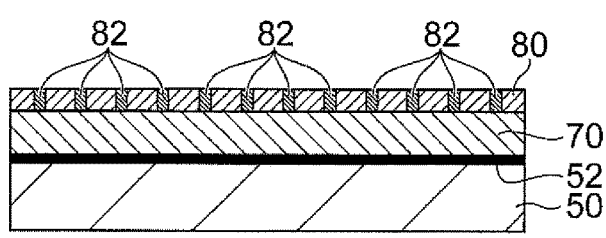
Figure 3:
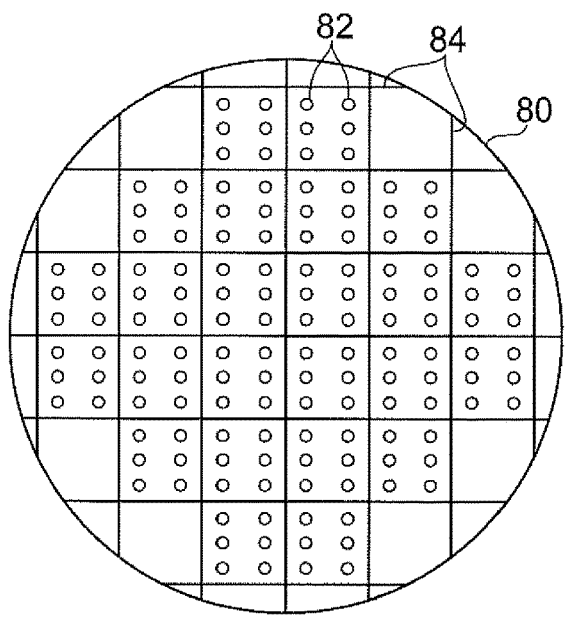

FIG. 3(A), FIG. 3(B), and FIG. 3(C) are schematic cross-sectional views for describing an embodiment of the processing method of a semiconductor wafer, and FIG. 3(D) is a top view which illustrates the semiconductor wafer after being processed.

<(a) Temporary Fixing Step>

FIG. 3(A) illustrates a step of temporarily fixing a semiconductor wafer 60 to a support 50 by interposing a film for temporary fixing 40 according to the present embodiment between the support 50 and the semiconductor wafer 60.

The thickness of the semiconductor wafer 60 is not particularly limited, but it can be set to from 600 to 800 μm.

First, a film for temporary fixing is prepared. Next, the film for temporary fixing is pasted on a circular support composed of glass or a wafer. After being pasted, the film for temporary fixing is cut into a circle in accordance with the shape of the support. At this time, it is preferable to set the shape to be cut in accordance with the shape of the semiconductor wafer to be processed as well. In addition, the film for temporary fixing may be pasted on the side of the semiconductor wafer to be processed but not to the support.

Next, the support provided with the film for temporary fixing is set on a vacuum press or a vacuum laminator and a semiconductor wafer is pressed by a press so as to be pasted thereto. Incidentally, in a case in which the film for temporary fixing is provided on the semiconductor wafer side, the wafer bonded with the film for temporary fixing is set on a vacuum press or a vacuum laminator and a support is pressed by a press so as to be pasted thereto.

In this manner, the semiconductor wafer 60 is temporarily fixed to the support 50 by interposing the film for temporary fixing 40 between the support 50 and the semiconductor wafer 60 as illustrated in FIG. 3(A).

In the case of using a wafer bonding device, the support 50 and the semiconductor wafer 60 are temporarily fixed via the film for temporary fixing 40 at the atmospheric pressure of 1 hPa or less, a pressing pressure of 1 MPa, a pressing temperature of from 60° C. to 200° C., and a retention time of from 100 seconds to 300 seconds, for example, by using the vacuum press EVG520IS (trade name) manufactured by EVG.

In the case of using a vacuum laminator, the support 50 and the semiconductor wafer 60 are temporarily fixed via the film for temporary fixing 40 at the atmospheric pressure of 1 hPa or less, a pressing temperature of from 40° C. to 180° C., and preferably from 60° C. to 150° C., a lamination pressure of from 0.01 to 0.5 MPa and preferably from 0.1 to 0.5 MPa, a retention time of from 1 second to 600 seconds and preferably from 30 seconds to 300 seconds, for example, by using the vacuum laminator LM-50×50-S (trade name) manufactured by NPC Incorporated or the vacuum laminator V130 (trade name) manufactured by Nikko-Materials Co., Ltd.

The thermal curing of the film for temporary fixing 40 is performed by heating after the support 50 and the semiconductor wafer 60 are temporarily fixed via the film for temporary fixing 40. Examples of the condition for the thermal curing may include heating the film for temporary fixing for 30 minutes at 110° C. and subsequently for 1 hour at 170° C.

The support of the present embodiment may be subjected to the peeling treatment, and a peeling layer 52 is formed by subjecting the whole or a part of the surface of the support 50 to the peeling treatment as illustrated in FIG. 3(A). The peeling agent to be used in the peeling treatment is not particularly limited, but for example, a surface modifying agent having a fluorine element, polyolefin wax and silicone oil, silicone oil containing a reactive group, and a silicone-modified alkyd resin are preferable since they are excellent in peeling properties.

When a film for temporary fixing having a configuration as described above, processing of a semiconductor wafer at a high temperature using a support is possible and the film for temporary fixing can be peeled off from the semiconductor wafer and the support without leaving an adhesive residue at room temperature after processing.

<(b) Processing Step>

The processing step includes grinding, electrode formation, metal wiring formation, protective film formation, and the like which are used at the wafer level. The grinding method is not particularly limited, and a known grinding method can be utilized. It is preferable to perform grinding while cooling the semiconductor wafer and the grindstone (such as a diamond) by pouring water over them.

For example, as illustrated in FIG. 3(B), the back surface of a semiconductor wafer 80, namely the surface opposite to the side in contact with the film for temporary fixing 70 of the semiconductor wafer 80 is ground by a grinder 90 to thin the thickness, for example, from about 725 μm up to 100 μm or less.

Examples of the device used in the grinding process may include the DGP-8761 (trade name) manufactured by DISCO Corporation, and the cutting conditions in this case can be arbitrarily selected depending on the desired thickness and grinding state of the semiconductor wafer.

Specific examples of other steps may include known processes such as metal sputtering for the formation of an electrode and the like, wet etching to etch the metal sputtering layer, formation of a pattern by coating, exposure, and development of a resist for masking of the metal wiring formation, peeling of the resist, dry etching, formation of the metal plating, silicon etching for the TSV formation, and formation of an oxide film on the silicon surface.

FIG. 3(C) illustrates an example in which the back surface side of the thinned semiconductor wafer 80 is subjected to the processing such as dry ion etching or the Bosch process to form a through hole, and then subjected to a treatment such as copper plating, whereby a through electrode 82 is formed.

The semiconductor wafer 80 is subjected to predetermined processing in this manner. FIG. 3(D) is a top view of the semiconductor wafer 80 after being processed.

As another aspect, it is possible to thin the thickness, for example, from about 700 μm up to 100 μm or less by preparing a thick semiconductor wafer on which a through electrode is prepared in advance, providing the circuit surface of this wafer with a film for temporary fixing, and grinding the back surface (the side opposite to the surface having the wiring pattern of the semiconductor wafer in the present embodiment) of the semiconductor wafer by a grinder. Next, a passivation film is formed by etching the thinned semiconductor wafer and performing cueing of the through electrode. Thereafter, a circuit is formed by performing cueing of the copper electrode again by ion etching and the like. A processed semiconductor wafer can be obtained in this manner.

<(c) Separation Step>

Figure 4:
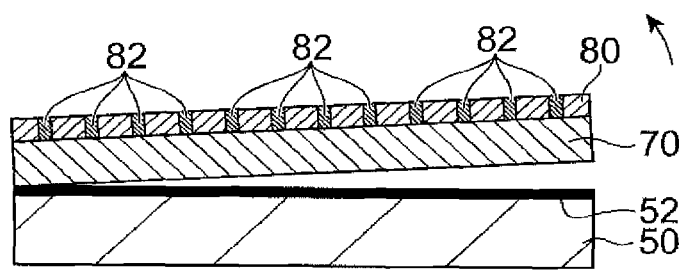
FIG. 4 is a schematic cross-sectional view for describing an embodiment of the separation step of separating the processed semiconductor wafer from the support and the film for temporary fixing.
Figure 4:
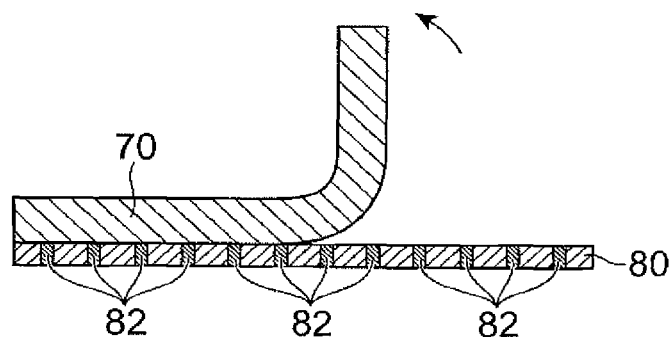
Figure 4:
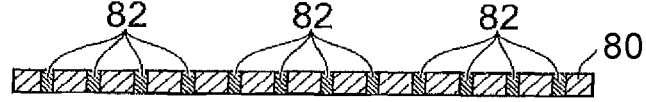

FIG. 4 is a schematic cross-sectional view for describing an embodiment of the separation step of separating the processed semiconductor wafer from the support and the film for temporary fixing. The separation step according to the present embodiment includes a first peeling step of peeling off the semiconductor wafer from the support and a second peeling step of peeling off the film for temporary fixing from the semiconductor wafer. The first peeling step is a step of peeling off the semiconductor wafer subjected to the processing in the processing step from the support, namely a step of peeling off the thinned semiconductor wafer after being subjected to various kinds of processing from the support before the thinned semiconductor wafer is diced. Examples of the peeling method may mainly include a method in which the semiconductor wafer and the support are separated from each other by sliding in the opposite directions along the horizontal direction while heating (preferably from 200 to 250° C.) both of them, a method in which the semiconductor wafer of the support or one of the support is horizontally fixed in advance and the other is lifted up from the horizontal direction with a certain angle, and a method in which a protective film is bonded on the grinding surface of the ground semiconductor wafer and the protective film and the semiconductor wafer are peeled off from the support by a peeling method, but any method can be employed without particular limitation.

All of these peeling methods are applicable to the present embodiment, but a method in which the semiconductor wafer 80 of the support or one of the support 50 is horizontally fixed in advance and the other is lifted up from the horizontal direction with a certain angle as illustrated in FIG. 4(A), and a method in which a protective film is bonded on the grinding surface of the ground semiconductor wafer and the protective film and the semiconductor wafer are peeled off from the support by a peeling method are more suitable. These peeling methods are usually carried out at room temperature, but they may be carried out at a temperature of about from 40 to 100° C. at which the semiconductor wafer is not damaged. For example, the De-Bonding device EVG805EZD manufactured by EVG is used when they are mechanically disassembled.

In addition, separation of the support 50 from the semiconductor wafer 80 can be performed, for example, by installing a jig in the form of a key-type at the interface between the film for temporary fixing and the semiconductor wafer so as to be hooked and applying a stress in the upward direction.

In the second peeling step, the semiconductor wafer 80 from which the film for temporary fixing is peeled off can be obtained (see FIG. 4(C)) by horizontally fixing the semiconductor wafer 80 in advance and lifting up the end of the film for temporary fixing 70 from the horizontal direction with a certain angle, for example, as illustrated in FIG. 4(B). In the present embodiment, it is possible to easily obtain a processed semiconductor wafer in which the residue such as an adhesive residue is adequately reduced by using the film for temporary fixing according to the present embodiment.

In the present embodiment, the separation between the semiconductor wafer and the film-shaped temporal fixing material may be performed in the first peeling step.

<(d) Cleaning Process>

A part of the temporary fixing material is likely to remain on the circuit forming surface of the semiconductor wafer. In a case in which the temporary fixing material partially remains on the circuit forming surface of the peeled semiconductor wafer, a cleaning step to remove this can be provided. Removal of the temporary fixing material can be performed, for example, by cleaning the semiconductor wafer.

The cleaning liquid to be used is not particularly limited as long as it is a cleaning liquid that can remove the partially remained temporary fixing material, and examples thereof may include the organic solvents which can be used in dilution of the resin composition for temporary fixing. These organic solvents may be used singly or in combination of two or more kinds thereof.

In addition, a base and an acid may be added to the organic solvent in a case in which it is difficult to remove the remained temporary fixing material. As the examples of the base, it is possible to use an amine such as ethanolamine, diethanolamine, triethanolamine, triethylamine, or ammonia; an ammonium salt such as tetramethylammonium hydroxide. As the acid, it is possible to use an organic acid such as acetic acid, oxalic acid, benzenesulfonic acid, or dodecylbenzenesulfonic acid. The amount thereof added is preferably from 0.01 to 10% by mass as a concentration in the cleaning liquid. In addition, an existing surfactant may be added in order to improve the removability of the remained substance.

The cleaning method is not particularly limited, but examples thereof may include a method in which cleaning is performed by using a paddle and the cleaning liquid, a cleaning method by spraying with a spray, and a method in which the semiconductor wafer is immersed in the cleaning liquid bath. The temperature is suitably from 10 to 80° C. and preferably from 15 to 65° C., and the thin type semiconductor wafer 80 is obtained by finally performing water washing or alcohol cleaning and the drying treatment.

Incidentally, as described above, according to the film for temporary fixing according to the present embodiment, it is possible to adequately reduce the residue such as an adhesive residue and thus it is possible to omit the cleaning step.

The through electrode 82 is formed on the processed semiconductor wafer 80 in the same manner as the above, and further the processed semiconductor wafer 80 is diced into individual pieces along a dicing line 84.

In the present embodiment, it is possible to manufacture a semiconductor device by connecting the semiconductor element thus obtained to another semiconductor element or a substrate for semiconductor element mounting.

Figure 5:
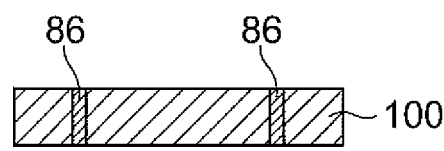
FIG. 5 is a schematic cross-sectional view for describing an embodiment of the method of manufacturing a semiconductor device.
Figure 5:
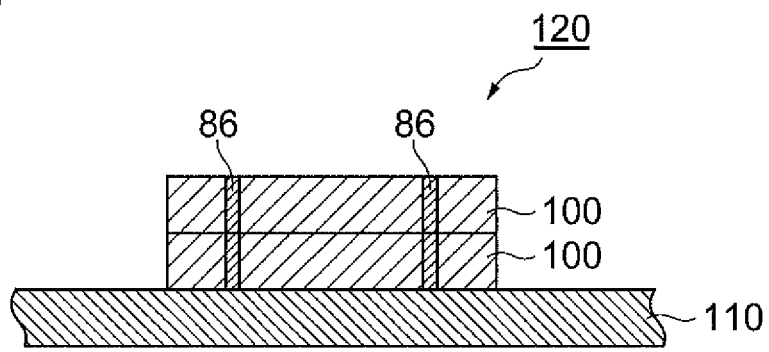

FIG. 5 is a schematic cross-sectional view for describing an embodiment of the method of manufacturing a semiconductor device. First, a semiconductor element 100 on which a through electrode 86 is formed and which is diced into individual pieces by the method described above is prepared (FIG. 5(A)). Thereafter, a semiconductor device 120 can be obtained by stacking a plurality of semiconductor elements 100 on a wiring board 110 (FIG. 5(B)).

EXAMPLES

Hereinafter, the present invention will be described in more detail with reference to Examples and Comparative Examples, but the present invention is not limited to the following Examples.

Examples 1 to 5 and Comparative Examples 1 and 2

A varnish was obtained by adding cyclohexanone to the composition having the composition presented in Table 1 or Table 2 (components and composition ratio (unit: parts by mass)) and stirring and mixing them together.

Next, the varnish thus obtained was filtered through a filter of 100 mesh and vacuum defoamed. The varnish after being vacuum defoamed was coated on a polyethylene terephthalate (PET) film which had a thickness of 38 μm and was subjected to the release treatment. The coated varnish was heated and dried in two stages of for 5 minutes at 90° C. and subsequently for 5 minutes at 140° C. In this manner, a film sheet for temporary fixing having a film for temporary fixing that was in the B-stage and had a thickness of 40 μm on a PET film as a support film was obtained. Incidentally, the temporary fixing material surface of the film sheet for temporary fixing thus obtained was bonded with a polyethylene (PE) film to have a three-layer structure so that the attachment of foreign matters to the temporary fixing material surface was prevented.

TABLE 1

|  |  | Example 1 | Example 2 | Example 3 | Example 4 | Example 5 |
|---|---|---|---|---|---|---|
| High molecular weight component | Acrylic rubber HTR-860P-30B | — | — | — | — | 100 |
|  | Acrylic rubber HTR-280-CHN | 100 | 100 | — | 100 | — |
|  | Acrylic rubber HRT-280-CHN modified 17 | — | — | 100 | — | — |
| Silicone-modified resin | KF105 | 10 | 20 | 20 | — | — |
|  | SH550 | — | 15 | 15 | 15 | 15 |
|  | SH3773M | — | — | — | 20 | 20 |
|  | TA31-209E | 20 | 40 | 40 | 40 | 40 |
| Polyimide resin | PI-1 | — | — | — | — | — |
| Curing accelerator | 2PZ-CN | 1 | 1 | 1 | 1 | 1 |

TABLE 2

|  |  | Comparative Example 1 | Comparative Example 2 | Comparative Example 3 |
|---|---|---|---|---|
| High molecular weight component | Acrylic rubber HTR-860P-30B | — | 100 | — |
|  | Acrylic rubber HTR-280-CHN | 100 | — | — |
| Silicone-modified resin | KF105 | — | 10 | — |
|  | SH550 | — | — | — |
|  | SH3773M | — | — | — |
|  | TA31-209E | — | 20 | — |
| Polyimide resin | PI-1 | — | — | 100 |
| Curing accelerator | 2PZ-CN | 1 | 1 | 1 |

Incidentally, the symbols for the respective components in Table 1 and Table 2 refer to the following substances.

(High Molecular Weight Component)

HTR-860P-30B: (acrylic rubber, sample name manufactured by Nagase ChemteX Corporation, weight average molecular weight: 250,000, Tg: 12° C.).

HTR-280-CHN: (acrylic rubber, sample name manufactured by Nagase ChemteX Corporation, weight average molecular weight: 900,000, Tg: −28° C.).

HTR-280-CHN modified 17: (acrylic rubber, sample name manufactured by Nagase ChemteX Corporation, weight average molecular weight: 900,000, Tg: −10° C.).

(Silicone-Modified Resin)

TA31-209E: (trade name manufactured by Hitachi Chemical Co., Ltd., silicone-modified alkyd resin)

KF-105: (trade name manufactured by Shin-Etsu Chemical Co., Ltd., epoxy-modified silicone)

SH-550: (trade name manufactured by Dow Corning Toray, methyl phenyl silicone)

SH3773M: (trade name manufactured by Dow Corning Toray, polyether-modified silicone)

(Curing Accelerator)

CUREZOL 2PZ-CN: (product name manufactured by Shikoku Chemicals Corporation, 1-cyanoethyl-2-phenylimidazole).

Comparative Example 3

[Synthesis of Polyimide Resin PI-1]

Into a flask equipped with a stirrer, a thermometer, a nitrogen purging device (nitrogen inflow tube), and a reflux condenser with a water receptor, 10.26 g (0.025 mol) of BAPP (trade name manufactured by TOKYO CHEMICAL INDUSTRY CO., LTD., 2,2-bis[4-(4-aminophenoxy)phenyl]propane), molecular weight: 410.51) and 5.10 g (0.025 mol) of 1,4-butanediol bis(3-aminopropyl) ether (trade name: B-12 manufactured by TOKYO CHEMICAL INDUSTRY CO., molecular weight: 204.31) of a diamine and 100 g of N-methyl-2-pyrrolidone (NMP) of a solvent were introduced and stirred to dissolve the diamines in the solvent. While cooling the flask in an ice bath, 26.11 g (0.05 mol) of decamethylene bistrimellitate dianhydride (DBTA) was added to the solution in the flask in small portions. After the addition was completed, the temperature of the solution was raised to 180° C. while blowing nitrogen gas into the flask, and kept for 5 hours, thereby obtaining a polyimide resin PI-1. The weight average molecular weight of the polyimide resin PI-1 was 50000, and Tg thereof was 70° C.

The polyimide resin PI-1 was dissolved in and mixed with NMP solvent so as to have a solid concentration of 50% by mass, thereby preparing a varnish for forming a film. A film sheet for temporary fixing was obtained by using this varnish in the same manner as described above.

[Evaluation of Film for Temporary Fixing]

The film sheets for temporary fixing of Examples 1 to 5 and Comparative Examples 1 to 3 obtained in the above were subjected to the evaluation on each of the melt viscosity, the step embedding properties, the heat resistance at 200° C., the modulus of elasticity after being cured, the 30° peel strength, and the peeling properties by the following methods. The results are presented in Tables 3 and 4.

<Melt Viscosity>

The melt viscosity of the film for temporary fixing was evaluated by the following method.

A film for temporary fixing having a thickness of 160 μm was obtained by superimposing four pieces of the films for temporary fixing (thickness: 40 μm) obtained in the above through roll lamination at 80° C. A rectangular laminate having an area of 10 mm² and a thickness of 160 μm was obtained by punching this in the thickness direction so as to have an area of 10 mm². A circular aluminum plate jig having a diameter of 8 mm was set to the dynamic viscoelasticity measuring device ARES (manufactured by Rheometric Scientific Inc.) and the punched laminate of the film for temporary fixing was further set here. Thereafter, the melt viscosity was measured while applying 5% strain to the laminate at 35° C. and raising the temperature to 150° C. at a rate of temperature rise of 20° C./min, and the melt viscosity at 120° C. was recorded.

<Step Embedding Properties>

The step embedding properties of the film-shaped pressure sensitive adhesive was evaluated by the following method.

A film for temporary fixing having a thickness of 80 μm was obtained by superimposing two pieces of the films for temporary fixing (thickness: 40 μm) obtained in the above through roll lamination at 80° C. Next, grooves having a width of 40 μm and a depth of 40 μm were prepared on the surface of a silicon mirror wafer (6 inches) having a thickness of 625 μm at an interval of 100 μm by blade dicing. The silicon mirror wafer with a step which was prepared in this manner was placed on the stage of a vacuum laminator (LM-50×50-S manufactured by NPC Incorporated) such that the step was to be the top surface, and the film for temporary fixing obtained in the above was installed thereon so as to be pasted to the side of the silicon mirror wafer with a step and vacuum laminated at 120° C./0.1 MPa/2 minutes and 15 mbar. The cross-section of the sample thus obtained was observed and the embedding properties of the grooves prepared by blade dicing were evaluated. The evaluation criteria for embedding properties are as follows.

◯: Proportion of voids is less than 5%.

X: Proportion of voids is 5% or more.

<Heat Resistance at 200° C.>

The heat resistance at 200° C. of the film for temporary fixing was evaluated by the following method.

A silicon mirror wafer (6 inches) having a thickness of 625 μm was diced into individual pieces having an area of 25 mm² by blade dicing. The film for temporary fixing was roll laminated on the surface of the silicon mirror wafer diced into individual pieces at 80° C. so as to be pasted. Next, a glass slide having a thickness of from 0.1 to 0.2 mm and a size of about 18 mm² was roll laminated on the film for temporary fixing at 80° C., thereby preparing a laminate product in which the film for temporary fixing was sandwiched between the silicon wafer and the glass slide. The film for temporary fixing was cured by heating the sample thus obtained for 30 minutes at 110° C. and subsequently for 1 hour at 170° C., and then heated for 30 minutes at 200° C.

The sample obtained in this manner was observed through the glass slide surface, the image was analyzed with software wafer such as Photoshop (registered trademark), and the heat resistance at 200° C. was evaluated by the percentage of voids occupying the entire area of the film for temporary fixing. The evaluation criteria are as follows.

◯: Proportion of voids is less than 5%.
X: Proportion of voids is 5% or more.

<Modulus of Elasticity after being Cured (at 23° C.)>

The tensile modulus of elasticity of the film for temporary fixing after being cured was evaluated by the following method.

A film for temporary fixing having a thickness of 120 μm was obtained by superimposing three pieces of the films for temporary fixing (thickness: 40 μm) obtained in the above through roll lamination at 80° C. The film for temporary fixing was heated for 30 minutes in an oven at 110° C. and further for 1 hour at 170° C., and then cut in the thickness direction so as to have a width of 4 mm and a length of 33 mm. Incidentally, the support film of the film sheet for temporary fixing was peeled off. The sample thus obtained was set to a dynamic viscoelasticity measuring device (product name: Rheogel-E4000 manufactured by UBM Co., Ltd.), a tensile load was applied to the sample, the tensile modulus of elasticity of the sample was measured at a frequency of 10 Hz and a rate of temperature rise of 3° C./min, and the value measured at 23° C. was recorded.

<30° Peel Strength>

The 30° peel strength between the silicon wafer and the film for temporary fixing was evaluated by the following method.

Grooves having a width of 40 μm and a depth of 40 μm were prepared on the surface of a silicon mirror wafer (6 inches) having a thickness of 625 μm at an interval of 100 μm by blade dicing. The silicon mirror wafer with a step which was prepared in this manner was placed on the stage of a vacuum laminator (LM-50×50-S manufactured by NPC Incorporated) such that the step was to be the top surface, and the film for temporary fixing obtained in the above was installed thereon so as to be pasted to the side of the silicon mirror wafer with a step and vacuum laminated at 120° C./0.1 MPa/2 minutes and 15 mbar. The sample thus obtained was cured by being heated for 30 minutes at 110° C. and subsequently for 1 hour at 170° C., then heated for 30 minutes at 200° C., and then cut so as to have a width of 10 mm. The peel test was performed at a speed of 300 mm/min by setting this to a peel tester so as to have a peeling angle of 30°, and the peel strength at that time was recorded.

<Peeling Properties>

The peeling properties of the film for temporary fixing by a debonding device were evaluated by the following method.

A film having a thickness of 100 μm was obtained by roll laminating the film for temporary fixing (thickness: 40 μm) obtained in the above and the support film (thickness: 60 μm) at 80° C.

The film obtained in the above was pasted to a silicon mirror wafer as a support through roll lamination at 80° C. such that the film for temporary fixing side was pasted to the silicon mirror wafer side, thereby obtaining a support with film for temporary fixing. Next, grooves having a width of 40 μm and a depth of 40 μm were prepared on the surface of a silicon mirror wafer (8 inches) having a thickness of 725 μm at an interval of 100 μm by blade dicing, thereby preparing a silicon mirror wafer with a step on the surface.

The step side of this silicon wafer and the film for temporary fixing side of the support with film for temporary fixing obtained in the above were vacuum pressed at 120° C./0.1 MPa/5 minutes and 5 mbar by a vacuum bonding device (VE07-14 manufactured by AYUMI INDUSTRY Co., Ltd.), thereby obtaining a laminate. The film for temporary fixing was cured by heating the laminate obtained in this manner for 30 minutes at 110° C. and subsequently for 1 hour at 170° C., then heated for 30 minutes at 200° C., then tweezers having a sharp tip was inserted between the step side of the silicon wafer and the film for temporary fixing, and the tweezers were allowed to move along the outer edge. Those in which the silicon wafer and the support were peeled off without being cracked were granted with ◯, and those in which they were not able to be peeled off or a damage was observed were granted with X.

TABLE 3

|  | Example 1 | Example 2 | Example 3 | Example 4 | Example 5 |
|---|---|---|---|---|---|
| Melt viscosity at 120° C. (Pa · s) | 3900 | 3000 | 5000 | 6500 | 8500 |
| Step embedding properties | ◯ | ◯ | ◯ | ◯ | ◯ |
| Heat resistance at 200° C. | ◯ | ◯ | ◯ | ◯ | ◯ |
| Modulus of elasticity after being cured at 23° C. (MPa · s) | 2.6 | 4.5 | 11 | 3.6 | 560 |
| 30° peel strength (N/m) | 280 | 200 | 280 | 70 | 200 |
| Peeling properties | ◯ | ◯ | ◯ | ◯ | ◯ |

TABLE 4

|  | Comparative Example 1 | Comparative Example 2 | Comparative Example 3 |
|---|---|---|---|
| Melt viscosity at 120° C. (Pa · s) | 13000 | 5000 | >15000 |
| Step embedding properties | ◯ | ◯ | X |
| Heat resistance at 200° C. | ◯ | ◯ | ◯ |
| Modulus of elasticity after being cured at 23° C. (MPa · s) | 3.0 | 1100 | 2000 |
| 30° peel strength (N/m) | >500 | >500 | >500 |
| Peeling properties | X | X | X |

As presented in Tables 3 and 4, it has been confirmed that the films for temporary fixing of Examples 1 to 5 have a low modulus of elasticity after being cured, a low 30° peel strength between the silicon wafer and the film for temporary fixing, and favorable peeling properties from the silicon wafer as well as they are excellent in step embedding properties of the silicon wafer and the heat resistance.

REFERENCE SIGNS LIST

1 . . . Film sheet for temporary fixing, 2 . . . Film sheet for temporary fixing, 10 . . . Support film, 20 . . . Film for temporary fixing, 30 . . . Protective film, 40 . . . Film for temporary fixing, 50 . . . Support, 52 . . . Peeling layer, 60 . . . Semiconductor wafer, 70 . . . Film for temporary fixing, 80 . . . Semiconductor wafer, 82 . . . Through electrode, 84 . . . Dicing line, 86 . . . Through electrode, 100 . . . Semiconductor element, 110 . . . Wiring board, 120 . . . Semiconductor device.

The invention claimed is:

1. A film for temporary fixing used in a processing method of a semiconductor wafer, the method including:
    a temporary fixing step of temporarily fixing the semiconductor wafer to a support via the film for temporary fixing;
    a processing step of processing the semiconductor wafer that is temporarily fixed to the support; and
    a separation step of separating the processed semiconductor wafer from the support and the film for temporary fixing;
    the film for temporary fixing comprising (A) a high molecular weight component and (B) a silicone-modified resin including a silicone-modified alkyd resin, wherein
    a modulus of elasticity of the film for temporary fixing after being heated for 30 minutes at 110° C. and for 1 hour at 170° C. is from 0.1 to 1000 MPa at 23° C., and a 30° peel strength between a semiconductor wafer and the film for temporary fixing after being heated for 30 minutes at 110° C. and subsequently for 1 hour at 170° C., and heated for 30 minutes at 200° C. is 300 N/m or less.

2. The film for temporary fixing according to claim 1, wherein (A) the high molecular weight component includes a (meth)acrylic copolymer having a glass transition temperature of from −50° C. to 50° C., a weight average molecular weight of from 100,000 to 1,200,000, and a crosslinkable functional group.

3. The film for temporary fixing according to claim 1, wherein a content of (B) the silicone-modified resin is from 1 to 100 parts by mass with respect to 100 parts by mass of (A) the high molecular weight component.

4. The film for temporary fixing according to claim 1, further comprising (C) a curing accelerator.

5. The film for temporary fixing according to claim 1, wherein a melt viscosity of the film for temporary fixing before being cured is 15000 Pa·s or less at 120° C. and a thickness of the film for temporary fixing is from 10 to 150 μm.

6. The film for temporary fixing according to claim 1, wherein (B) the silicone-modified resin further includes polyether-modified silicone, alkyl-modified silicone, or epoxy-modified silicone.

7. The film for temporary fixing according to claim 1, wherein the modulus of elasticity of the film for temporary fixing after being heated for 30 minutes at 110° C. and for 1 hour at 170° C. is from 2.6 to 1000 MPa at 23° C., and a melt viscosity of the film for temporary fixing before being cured is 8500 Pa-s or less at 120° C.

8. A film sheet for temporary fixing comprising a support film exhibiting releasability and the film for temporary fixing according to claim 1 provided on the support film.

9. The semiconductor device comprising a semiconductor element obtained from a semiconductor wafer processed by using the film sheet for temporary fixing according to claim 8.

10. A semiconductor device comprising a semiconductor element obtained from a semiconductor wafer processed by using the film for temporary fixing according to claim 1.

11. A processing method of a semiconductor wafer, the method including:
    a temporary fixing step of temporarily fixing a semiconductor wafer to a support via a film for temporary fixing, the film for temporary fixing comprising (A) a high molecular weight component and (B) a silicone-modified resin including a silicone-modified alkyd resin, wherein a modulus of elasticity of the film for temporary fixing after being heated for 30 minutes at 110° C. and for 1 hour at 170° C. is from 0.1 to 1000 MPa at 23° C., and a 30° peel strength between a semiconductor wafer and the film for temporary fixing after being heated for 30 minutes at 110° C. and subsequently for 1 hour at 170° C., and heated for 30 minutes at 200° C. is 300 N/m or less;
    a processing step of processing the semiconductor wafer that is temporarily fixed to the support; and
    a separation step of separating the processed semiconductor wafer from the support and the film for temporary fixing.

12. The processing method of a semiconductor wafer according to claim 11, wherein (A) the high molecular weight component includes a (meth)acrylic copolymer having a glass transition temperature of from −50° C. to 50° C., a weight average molecular weight of from 100,000 to 1,200,000, and a crosslinkable functional group.

13. The processing method of a semiconductor wafer according to claim 11, wherein a content of (B) the silicone-modified resin is from 1 to 100 parts by mass with respect to 100 parts by mass of (A) the high molecular weight component.

14. The processing method of a semiconductor wafer according to claim 11, further comprising (C) a curing accelerator.

15. The processing method of a semiconductor wafer according to claim 11, wherein a melt viscosity of the film for temporary fixing before being cured is 15000 Pa·s or less at 120° C. and a thickness of the film for temporary fixing is from 10 to 150 μm.

16. The processing method of a semiconductor wafer according to claim 11, wherein (B) the silicone-modified resin further includes polyether-modified silicone, alkyl-modified silicone, or epoxy-modified silicone.

17. The processing method of a semiconductor wafer according to claim 11, wherein the modulus of elasticity of the film for temporary fixing after being heated for 30 minutes at 110° C. and for 1 hour at 170° C. is from 2.6 to 1000 MPa at 23° C., and a melt viscosity of the film for temporary fixing before being cured is 8500 Pa-s or less at 120° C.

* * * * *